United States Patent

[11] 3,631,356

[72] Inventor Wilfried Aschermann
Volkswohleweg 1, 21 Hamburg 90, Germany
[21] Appl. No. 885,543
[22] Filed Dec. 16, 1969
[45] Patented Dec. 28, 1971
[32] Priority Dec. 20, 1968
[33] Germany
[31] P 18 16 034.4

[54] CONTROLLABLE AMPLIFIER STAGE
6 Claims, 2 Drawing Figs.

[52] U.S. Cl. .......... 330/30 D, 330/29, 330/30 D, 330/38 M
[51] Int. Cl. .......... H03f 3/68
[50] Field of Search .......... 330/29, 30, 30 D, 38, 38 M, 69

[56] References Cited
UNITED STATES PATENTS

| | | | |
|---|---|---|---|
| 3,419,810 | 12/1968 | Xylander | 330/30 X |
| 3,502,997 | 3/1970 | Narud et al. | 330/38 X |
| 3,512,096 | 5/1970 | Nagata et al. | 330/29 |

*Primary Examiner*—Robert Segal
*Assistant Examiner*—Lawrence J. Dahl
*Attorney*—Frank R. Trifari

ABSTRACT: An integrated signal-controlled amplifier stage uses a differential amplifier emitter coupled to a signal input amplifying transistor connected in the grounded emitter configuration. In order to provide DC stabilization of the output transistor in the differential amplifier a first resistor is connected between a source of constant potential and the output collector of the differential amplifier to provide direct current to the output transistor and, through a second resistor connecting the collectors of the differential amplifier, to the control voltage transistor of the differential amplifier. In addition, a capacitor is connected between the collector of the control voltage transistor and ground.

*INVENTOR.*
WILFRIED ASCHERMANN
BY
[signature]
AGENT

CONTROLLABLE AMPLIFIER STAGE

The invention relates to a controllable amplifier stage, in particular in the form of an integrated circuit, comprising a differential amplifier which includes at least a first and a second transistor the emitters of which are connected through a high-resistance signal source to a point of constant potential, the difference of the base bias voltages of the two transistors being dependent upon a control voltage, while the amplified signal can be taken from the collector of the first transistor.

Figure 1:
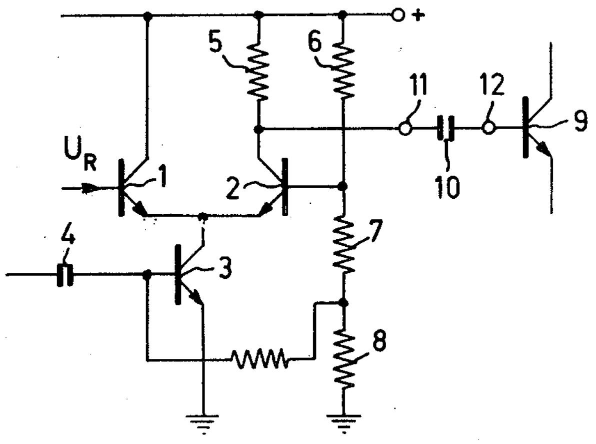

A known amplifier stage of this kind is shown in FIG. 1. This known amplifier stage comprises two transistors 1 and 2. The emitters of these transistors are connected to a point of constant potential through the collector emitter path of a transistor 3. The signal to be amplified is applied to the base of the transistor 3 through a capacitor 4. The amplified signal is taken from the collector 5 of the transistor 2 of the differential amplifier. The base bias voltage of the transistor 2 is obtained by means of resistors 6, 7 and 8, and a (smaller) base bias voltage for the transistor 3 is also derived by means of these resistors. As the base bias voltage for the transistor 1 a control voltage $U_R$ is used which depends upon the signal amplitude and which modifies the division of the current supplied by the transistor 3 so that the signal amplification decreases as the control signal increases. Apart from having a large control range, this known amplifier stage has the advantage that its input resistance to the signal to be amplified is constant, because the control voltage at the input of the transistor 1 does not influence the input resistance of the transistor 3. A disadvantage is, however, that during a control operation both the amplification and the direct voltage which appears at the output are varied so that a coupling capacitance is required to render the stage (transistor 9) succeeding this control stage independent of the variation in the direct voltage caused by the control voltage. This has the disadvantage that, if the amplifier is a direct voltage amplifier, no direct voltage for bias stabilization of the transistor 3 can be derived from the stage comprising the transistor 9. In addition, in an integrated circuit such a coupling capacitance requires two connections to be brought out, because capacitors having a large capacitance value cannot be made in integrated form. In designing integrated circuits attempts are made to reduce the number of brought-out connections to a minimum because the number of possible connections is limited.

Circuit arrangements including differential amplifiers are known in which when they are designed as integrated circuits only a single external brought-out connection is required to render the direct voltage at the output independent of the control voltage. Thus, for example, from the U.S. Pat. No. 2,553,673 a tube circuit arrangement is known including a differential amplifier having a common anode resistor and a common cathode resistor shunted by a capacitor. The signal voltage is applied to the grid of one tube and the control voltage is applied to the grid of the other tube and, as the case may be, (with opposite phase) to the grid of the first-mentioned tube, so that a direct voltage independent of the control voltage is set up across the anode resistor. If this circuit is integrated, only one external connection for the coupling capacitor is required which short circuits the cathode resistor for signal frequencies (the other connection of the coupling capacitor is externally connected to earth). However the input resistance is highly dependent upon the control voltage, and this is particularly troublesome when the signal is applied through a filter.

Furthermore, from U.S. Pat. Nos. 3,141,137 and 3,210,683 an amplifier circuit comprising four transistors is known. Each transistor has one electrode in common with each of the three remaining transistors. The four transistors constitute two differential amplifiers which each comprise two transistors. In each of the differential amplifiers the emitters of the transistors are connected together. The emitter supply lead of one differential amplifier includes a signal source and a direct current source. The emitter supply lead of the other differential amplifier includes a direct current source which supplies a direct current equal to the direct current supplied by the direct current source in the emitter supply lead of the first-mentioned differential amplifier. In this known circuit arrangement, a variation of the control voltage will cause the collector direct current of a transistor of one differential amplifier to decrease by a given amount, while the direct current of that transistor of the other differential amplifier the collector of which is connected to that of the first-mentioned transistor will increase by an equal amount. Hence, the sum of the two collector direct currents is constant, which means that the output direct voltage is independent of the control voltage.

An advantage of this circuit arrangement is that for this purpose no external connection is required, because the circuit arrangement comprises only circuit elements of the kinds which can readily be integrated. The circuit arrangement, however, has the disadvantage that in addition to the collector direct current noise currents will occur so that the amplifier cannot be used for small signals which require low-noise amplification.

The above-mentioned disadvantages are avoided if according to the invention the collector signal current of the second transistor is diverted to ground and the collector direct current is supplied to the collector of the first transistor.

The invention will be described more fully with reference to FIG. 2.

Figure 2:
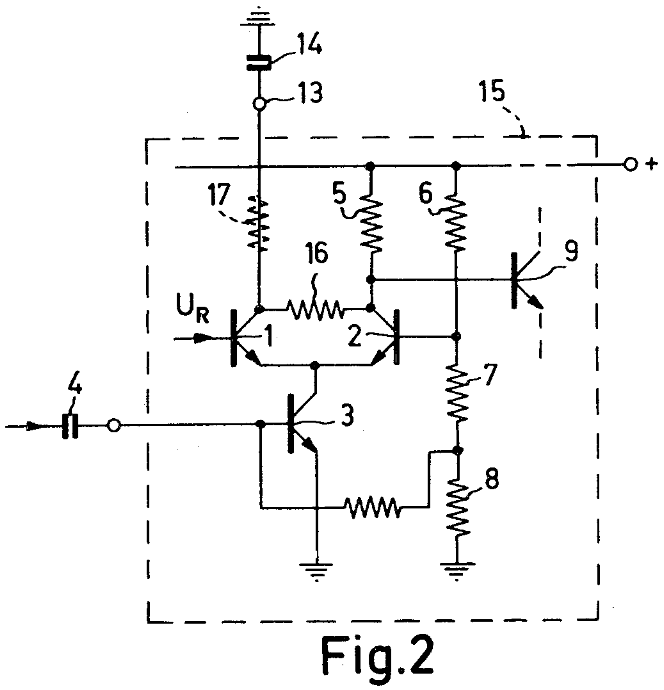

FIG. 2 shows an amplifier which broadly corresponds to the amplifier shown in FIG. 1. A broken line 15 indicates that the circuit is integrated. In contrast with what is the case in the circuit arrangement of FIG. 1, the collector current of a transistor 1 which is not used for the amplification is divided into a signal current component and a direct current component. The signal current is diverted to ground through a brought-out connection 13 and a capacitor 14. The direct current is supplied to the collector of a transistor 2 through a resistor 16. Since the sum of the two collector direct currents is equal to the direct current supplied by a transistor 3 and since the latter direct current is independent of the control voltage $U_R$, the direct current flowing through a collector resistor 5 of the transistor 2 is also independent of the control voltage. Although the direct current of the transistor 1 is added to the direct current of the transistor 2, the noise will not be increased because the noise current caused by the transistor 1 is diverted to ground through the capacitor 14. In designing the circuit arrangement allowance must be made for the fact that when the amplification is completely reduced, i.e. when the current supplied by the transistor 3 flows substantially completely through the transistor 1, the voltage drop across the series arrangement of the resistors 5 and 16 is not such as to render the base collector diode of this transistor conductive, for part of the current supplied by the transistor 3 will flow away through the base so that the direct current through the resistor 5 and hence the direct voltage across this resistor will decrease. Hence, the sum of the resistances of the resistors 5 and 16 must be chosen so that the base collector diode of the transistor just does not become conductive when driven. In this case, maximum amplification is obtained if the resistances of the resistors 5 and 6 are equal and each are one-half of the permissible sum of the resistances. The capacitance of the capacitor 14 must be chosen so that at the lowest signal frequency and with unity amplification the signal current flowing away through the resistor 16 does not exceed the signal current flowing through the transistor 2. This requirement is substantially satisfied if at the lowest signal frequency the impedance of the capacitor 14 is smaller than the sum of the resistances of the two resistors 5 and 16 by at least twice the control factor, the control factor being equal to the ratio between maximum and minimum amplification.

If the amplification must not drop below a given value, a resistor 17 connected in series with the capacitor 14 may be included. Thus, with a sufficiently large capacitance of the capacitor 14, the lowest degree of amplification is determined by the ratio between the resistor 1 and the sum of the resistors 5 and 16.

If the amplifier which includes the transistor 9 and succeeds the above,described stage is a direct voltage amplifier, there may be provided from a suitably chosen point of this amplifier a direct current negative feedback which increases the bias stabilization of the stage.

Alternatively, the base of the transistor 1 may be connected to a point of constant potential and the base of the transistor 2 may be controlled by means of the control voltage. This requires the use of a control voltage which decreases with increasing input signal.

What is claimed is:

1. A voltage-controllable amplifier stage, comprising a first transistor having a collector, an emitter and a base, a second transistor having a collector, an emitter and a base, the first and second transistors comprising a differential amplifier, a current source means connected to the emitters of both the first and second transistors for providing a signal alternating about a constant current, means for connecting the base of the second transistor to a control voltage, means for connecting the base of the first transistor to a fixed potential, a first impedance means connecting the collectors of the first and the second transistors, a second impedance means connecting the collector of the first transistor to a source of constant potential for conducting substantially all the direct current flowing through the first and the second transistors, a third impedance means connecting the collector of the second transistor to ground potential for diverting alternating current appearing at the collector of the second transistor to ground, the collector of the first transistor comprising the output of the amplifier stage.

2. A controlled amplifier stage as claimed in claim 1, wherein the third impedance means comprises a capacitor.

3. An amplifier stage as claimed in claim 1, wherein the first impedance means comprises a resistor.

4. An amplifier stage as claimed in claim 2, wherein the first impedance means comprises a resistor, and wherein the second impedance means comprises a resistor.

5. An amplifier stage as claimed in claim 4, wherein the sum of the resistors comprising the first and second impedances is greater than the impedance of the capacitor comprising the third resistance by at least twice the control factor at the lowest signal frequency.

6. A controllable amplifier stage as claimed in claim 4 wherein an additional resistor (17) is connected in series with the capacitor (14).

* * * * *